(12) United States Patent
An

(10) Patent No.: US 9,349,777 B2
(45) Date of Patent: May 24, 2016

(54) DISPLAY DEVICE AND OPERATING METHOD THEREOF

(71) Applicant: Samsung Display Co., Ltd., Yongin, Gyeonggi-Do (KR)

(72) Inventor: Ju-Bong An, Yongin (KR)

(73) Assignee: Samsung Display Co., Ltd., Yongin-si, Gyeonggi-Do (KR)

( * ) Notice: Subject to any disclaimer, the term of this patent is extended or adjusted under 35 U.S.C. 154(b) by 147 days.

(21) Appl. No.: 14/134,480

(22) Filed: Dec. 19, 2013

(65) Prior Publication Data

US 2014/0307395 A1 Oct. 16, 2014

(30) Foreign Application Priority Data

Apr. 12, 2013 (KR) .................. 10-2013-0040650

(51) Int. Cl.
*H05K 1/02* (2006.01)
*H01L 27/32* (2006.01)
*H01L 51/00* (2006.01)
*G06F 1/16* (2006.01)

(52) U.S. Cl.
CPC .......... *H01L 27/3244* (2013.01); *G06F 1/1652* (2013.01); *H01L 51/0097* (2013.01); *H01L 2251/5338* (2013.01); *Y10T 29/49117* (2015.01)

(58) Field of Classification Search
CPC .................................................... H05K 1/028
See application file for complete search history.

(56) References Cited

U.S. PATENT DOCUMENTS

| 8,908,365 | B2* | 12/2014 | Walters et al. ........... 361/679.27 |
| 2006/0146514 | A1* | 7/2006 | Douglas .......................... 362/84 |
| 2008/0291225 | A1* | 11/2008 | Arneson ....................... 345/698 |
| 2012/0320623 | A1* | 12/2012 | Wada ............................ 362/602 |
| 2013/0044215 | A1* | 2/2013 | Rothkopf et al. ............. 348/143 |
| 2015/0109723 | A1* | 4/2015 | Holtzman ................ 361/679.03 |
| 2015/0154936 | A1* | 6/2015 | Lee et al. |
| 2015/0177782 | A1* | 6/2015 | Saitoh et al. |
| 2015/0185781 | A1* | 7/2015 | Yu et al. |
| 2015/0223358 | A1* | 8/2015 | Nam et al. |

FOREIGN PATENT DOCUMENTS

| KR | 10-2002-0007278 A | 1/2002 |
| KR | 10-2012-0083804 A | 7/2012 |
| KR | 1020140002102 A | 1/2014 |

* cited by examiner

*Primary Examiner* — Timothy L Rude
(74) *Attorney, Agent, or Firm* — Robert E. Bushnell, Esq.

(57) ABSTRACT

A display device including a bendable display panel, and an operation method thereof. The display device includes a display panel including a flexible substrate and a display unit and a bending adjusting member fixed to a rear surface of the display panel, and changeable between a flat state and a bending state by external force. The bending adjusting member is bent in a width direction to form a curvature, has elasticity in the width direction and a longitudinal direction, and is maintained in any one state between the flat state and the bending state under a condition of non-application of external force.

14 Claims, 10 Drawing Sheets

DISPLAY DEVICE AND OPERATING METHOD THEREOF

CLAIM PRIORITY

This application makes reference to, incorporates the same herein, and claims all benefits accruing under 35 U.S.C. §119 from an application earlier filed in the Korean Intellectual Property Office on 12 Apr. 2013 and there duly assigned Serial No. 10-2013-0040650.

BACKGROUND OF THE INVENTION

1. Field of the Invention

The described technology relates generally to a display device.

2. Description of the Related Art

As a flat panel display, a liquid crystal display (LCD) and an organic light emitting diode (OLED) display are publicly known. When the liquid crystal display (LCD) and the organic light emitting diode (OLED) display employ a flexible substrate, such as a polymer film as a substrate on which a display unit is to be formed, the liquid crystal display (LCD) and the organic light emitting diode (OLED) display may have a bendable property.

The above information disclosed in this Related Art section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a display device including a bendable display panel, in which a plane state and a bending state of the display panel are easily changed, a shape of the display panel is uniformly maintained in each of the plane state and the bending state, and a bending shape of the display panel is variously controllable, and a method of operating the same.

An exemplary embodiment provides a display device, including: a display panel including a flexible substrate and a display unit; and a bending adjusting member fixed to a rear surface of the display panel, and changeable between a flat state and a bending state by external force. The bending adjusting member may be bent in a width direction to form a curvature, have elasticity in the width direction and a longitudinal direction, and be maintained in any one state between the flat state and the bending state under a condition of non-application of external force.

The bending adjusting member may be bent in the longitudinal direction by first external force to be switched to the bending state, and may return to the flat state by second external force. The first external force and the second external force may have the same intensity and opposite directions.

The bending adjusting member may be disposed so that a concave surface faces the display panel, and an adhesive layer may be positioned between the display panel and the bending adjusting member.

The adhesive layer may have a stretch ratio in the width direction and the longitudinal direction of the bending adjusting member.

The bending adjusting member may be provided with at least two pairs of concave recesses in both side surfaces parallel in the longitudinal direction, and may be divided into at least three bending areas in the longitudinal direction by at least two pairs of concave recesses. Each of at least three bending areas may be independently changeable between the flat state and the bending state.

A length of the bending adjusting member may be larger than a length of the display panel, and the bending adjusting member may be provided with a pair of first concave recesses and a pair of second concave recesses at an external side of the display panel. The display panel may face one bending area positioned between the pair of first concave recesses.

The bending adjusting member may be provided with one pair of third concave recesses and one pair of fourth concave recesses at positions facing the display panel, and the display panel may face three bending areas divided by the one of the pairs of first to fourth concave recesses.

On the other hand, the bending adjusting member may be provided with one pair of first concave recesses and one pair of second concave recesses at positions facing the display panel, and the display panel may face three bending areas divided by the one pair of first and second concave recesses. The display panel may be an organic light emitting display panel.

Another exemplary embodiment provides a method of operating a display device, including: providing a display device including a bendable display panel, and a bending adjusting member fixed to a rear surface of the display panel, bent in a width direction to form a curvature, and having elasticity in the width direction and a longitudinal direction; switching states of the bending adjusting member and the display panel to a bending state by applying first external force to the bending adjusting member; and switching states of the bending adjusting member and the display panel to a flat state by applying second external force to the bending adjusting member. The bending adjusting member may be maintained in any one state between the bending state and the flat state under a condition of non-application of external force.

The first external force and the second external force may have the same intensity and opposite directions. The bending adjusting member may be provided with at least two pairs of concave recesses in both side surfaces parallel in the longitudinal direction to be divided into at least three bending areas in the longitudinal direction. The switching to the bending state and the switching to the flat state may be individually performed at each of at least three bending areas.

Another exemplary embodiment provides a display device, including: a display panel including a flexible substrate and a display unit; a bending adjusting member fixed to a rear surface of the display panel, and changeable between a flat state and a bent state; said bending adjusting member comprising; at least two pairs of concave recesses in both side surfaces parallel in the longitudinal direction: and a bending area between each pair of concave recesses and on opposite ends of the bending adjusting member in the longitudinal direction.

The switching between the flat and bent state occurs individually at each of the bending areas.

A length of the bending adjusting member is larger than a length of the display panel.

The bending adjusting member is disposed so that a concave surface faces the display panel; and an adhesive layer is positioned between the display panel and the bending adjusting member.

The adhesive layer has a stretch ratio in the width direction and the longitudinal direction of the bending adjusting member.

The bending adjusting member is bent in a width direction to form a curvature, has elasticity in the width direction and a longitudinal direction, and is maintained in any one state between the flat state and the bent state under a condition of non-application of external force.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
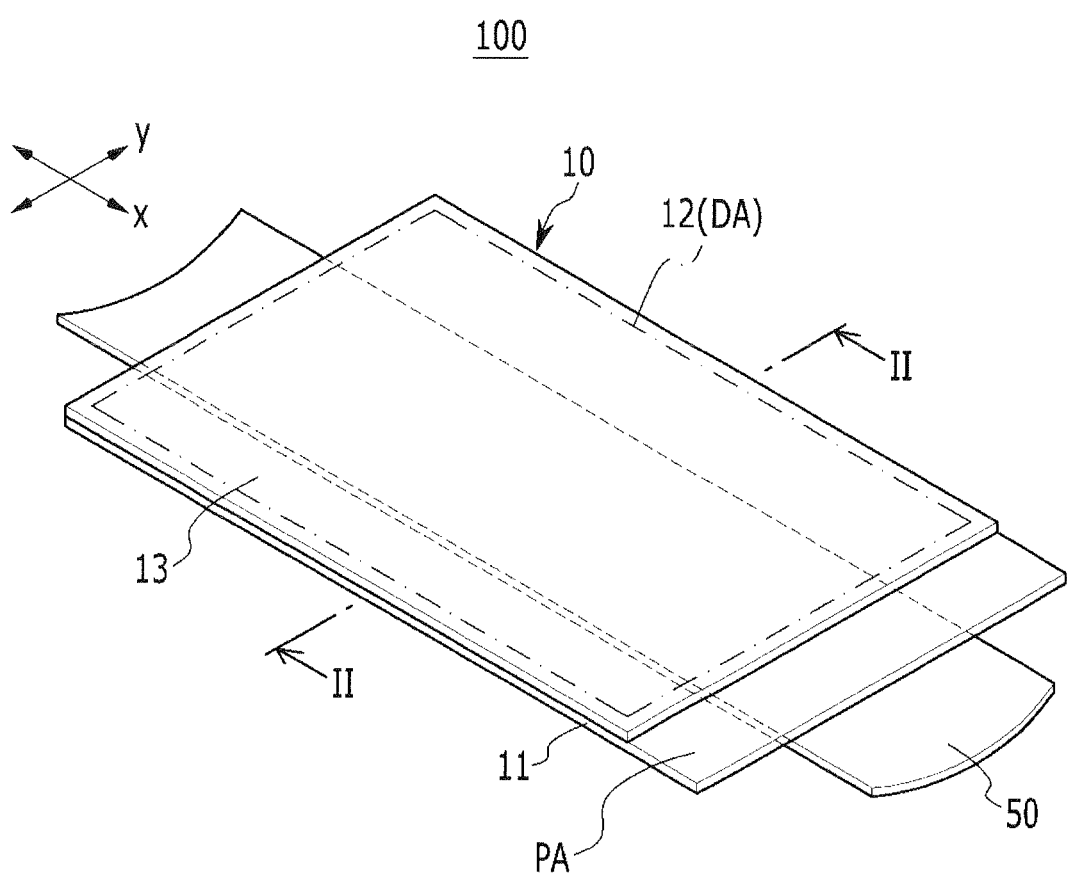
FIG. 1 is a perspective view of a display device according to a first exemplary embodiment.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In bendable display panels a technical difficulty in maintaining a bent shape may occur. Accordingly, the display panel is mainly combined with a supporting structure, such as a flexible body to maintain a bending state via the supporting structure.

Figure 2:
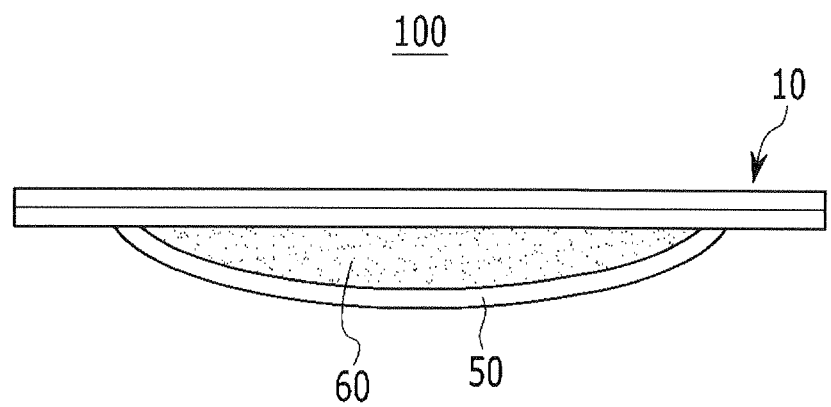
FIG. 2 is a cross-sectional view of the display device taken along line II-II of FIG. 1.

FIG. 1 is a perspective view of a display device according to a first exemplary embodiment, and FIG. 2 is a cross-sectional view of the display device taken along line II-II of FIG. 1.

Referring to FIGS. 1 and 2, a display device 100 of the first exemplary embodiment includes a bendable display panel 10, and a bending adjusting member 50 fixed to a rear surface of the display panel 10. The bending adjusting member 50 may be deformed by external force to be changed between a flat state and a bending state, and stably maintains any one shape between the flat state and the bending state.

When the bending adjusting member 50 is in the flat state, the display panel 10 maintains a plane state, and when the bending adjusting member 50 is in the bending state, the display panel 10 is bent to form a predetermined curvature. That is, the shape of the display panel 10 is determined by the bending adjusting member 50, and is uniformly maintained in each of the plane state and the bending state by the bending adjusting member 50.

The display panel 10 may be an organic light emitting display panel including an organic light emitting diode (OLED). In this case, the display panel 10 includes a flexible substrate 11, and a display unit 12 and a thin film encapsulation layer 13 formed on the flexible substrate 11.

The flexible substrate 11 may be formed of a transparent or opaque polymer film (for example, polyimide). The flexible substrate 11 is divided into a display area DA and a pad area PA. The display unit 12 including a plurality of organic light emitting diodes and a plurality of pixel circuits is positioned in the display area DA. One organic light emitting diode and one pixel circuit are provided for each pixel. The display unit 12 combines light emitted from the plurality of organic light emitting diodes to display an image.

Pad electrodes (not illustrated) connected with each pixel circuit of the display unit 12 are positioned in the pad area PA. The pad electrodes are electrically connected with a chip on film (COF) and a printed circuit board (PCB) (not illustrated) to receive a control signal necessary for driving the pixel.

Figure 3:
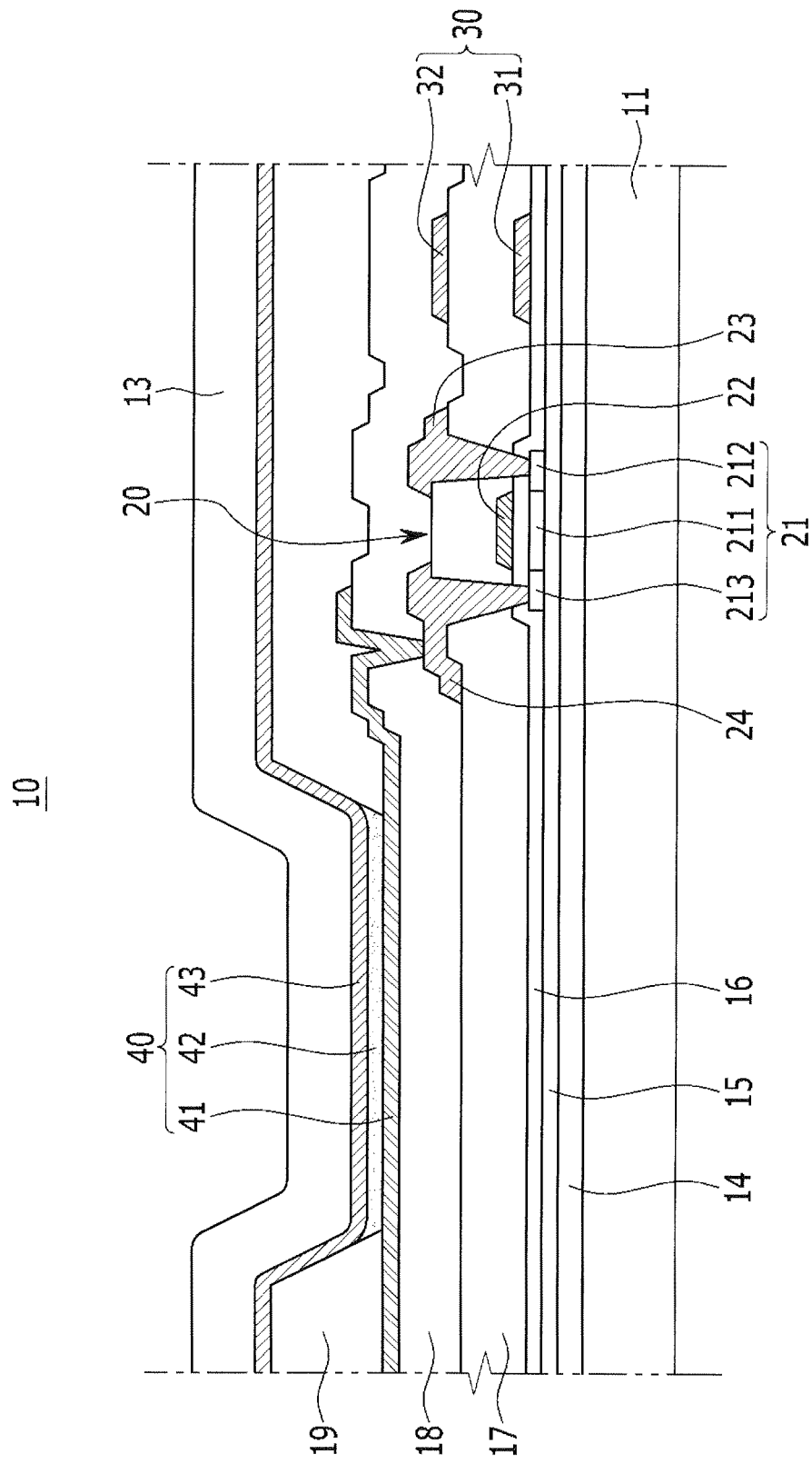
FIG. 3 is an enlarged cross-sectional view illustrating one pixel in the display panel illustrated in FIG. 1.

FIG. 3 is an enlarged cross-sectional view illustrating one pixel in the display panel illustrated in FIG. 1.

Referring to FIG. 3, a barrier layer 14, a buffer layer 15, a thin film transistor 20, a capacitor 30, and an organic light emitting diode 40 are positioned on the flexible substrate 11. The thin film transistor 20 and the capacitor 30 configure the pixel circuit.

The barrier layer 14 includes a plurality of inorganic films, and for example, may be formed in a structure in which $SiO_2$ and SiNx layers are alternately and repeatedly stacked. The barrier layer 14 has a lower moisture transmission rate and a lower oxygen transmission rate than those of the flexible substrate 11, thereby suppressing moisture and oxygen, which transmit the flexible substrate 11, from permeating into the pixel circuit and the organic light emitting diode 40.

The buffer layer 15 is formed of an inorganic film, and may include, for example, $SiO_2$ or SiNx. The buffer layer 15 provides a flat surface for forming the pixel circuit, and suppresses moisture and foreign materials from permeating into the pixel circuit and the organic light emitting diode 40.

The thin film transistor 20 and the capacitor 30 are formed on the buffer layer 15. The thin film transistor 20 includes a semiconductor layer 21, a gate electrode 22, and source/drain electrodes 23 and 24. The semiconductor layer 21 is formed of poly silicon or an oxide semiconductor, and includes a channel area 211 on which impurity is not doped, and source/drain areas 212 and 213 formed by doping impurities on both sides of the channel area 211. When the semiconductor layer 21 is formed of an oxide semiconductor, a separate passivation layer may be added for protecting the semiconductor layer 21.

A gate insulating layer 16 is formed between the semiconductor layer 21 and the gate electrode 22, and an interlayer insulating layer 17 is positioned between the gate electrode 22 and the source/drain electrodes 23 and 24. A capacitor 30 includes a first capacitor plate 31 formed on the gate insulating layer 16 and a second capacitor plate 32 formed on the interlayer insulating layer 17. The first capacitor plate 31 may be formed of the same material as that of the gate electrode 22, and the second capacitor plate 32 may be formed of the same material as those of the source/drain electrodes 23 and 24. The second capacitor plate 32 may be connected with the source electrode 23.

The thin film transistor 20 illustrated in FIG. 3 is a driving thin film transistor, and the pixel circuit further includes a switching thin film transistor (not illustrated). The switching thin film transistor is used as a switching element for selecting a pixel desired to emit light, and the driving thin film transistor applies a power source for permitting the selected pixel to emit light to the corresponding pixel.

A planarization layer 18 is positioned on the source/drain electrodes 23 and 24 and the second capacitor plate 32. The planarization layer 18 may be formed of an organic material or an inorganic material, or formed of a complex form of an organic material and an inorganic material. The planarization layer 18 is provided with a via hole through which a part of the drain electrode 24 is exposed, and the organic light emitting diode 40 is formed on the planarization layer 18.

The organic light emitting diode 40 includes a pixel electrode 41, an organic emission layer 42, and a common electrode 43. The pixel electrode 41 is individually formed in each pixel, and is connected with the drain electrode 24 of the thin film transistor 20 through the via hole. The common electrode 43 is formed in the entire display area DA. A pixel defining layer 19 is positioned on the pixel electrode 41. The pixel defining layer 19 is provided with an opening through which the pixel electrode 41 is exposed, and the organic emission layer 42 is formed at the opening of the pixel defining layer 19 to be in contact with the pixel electrode 41.

The organic emission layer 42 may be any one among a red emission layer, a green emission layer, and a blue emission layer. On the other hand, the organic emission layer 42 may be a white emission layer, or a stacked layer of a red emission layer, a green emission layer, and a blue emission layer. In the latter, the display panel 10 may further include a color filter (not illustrated). The color filter includes a red filter corresponding to a red pixel, a green filter corresponding to a green pixel, and a blue filter corresponding to a blue pixel.

Any one of the pixel electrode 41 and the common electrode 43 is an anode which is a hole injection electrode, and the other one is a cathode which is an electron injection electrode. The holes injected from the anode and the electrons injected from the cathode are combined in the organic emission layer 42 to form exciton, and light is emitted while the exciton discharges energy.

At least one layer between a hole injection layer and a hole transport layer may be positioned between the anode and the organic emission layer 42, and at least one layer between an electron injection layer and an electron transport layer may be positioned between the cathode and the organic emission layer 42. The hole injection layer, the hole transport layer, the electron transport layer, and the electron injection layer may be formed on the entire display area DA without distinction of pixel.

The pixel electrode 41 may be formed of a reflective layer, and the common electrode 43 may be formed of a semi-transmitting film or a transparent conductive layer. Light emitted from the organic emission layer 42 is reflected from the pixel electrode 41, and transmits the common electrode 43 to be discharged to the outside. When the common electrode 43 is the semi-transmitting film, a part of light is re-reflected from the common electrode 43 to the pixel electrode 41 to have a resonant structure.

The thin film encapsulation layer 13 is positioned on the plurality of organic light emitting diodes 40. The thin film encapsulation layer 13 seals the organic light emitting diodes 40 from an external environment including moisture and oxygen to suppress the organic light emitting diodes 40 from deteriorating due to moisture and oxygen. The thin film encapsulation layer 13 may be formed in a configuration in which each of a plurality of organic films and each of a plurality of inorganic films are alternately stacked.

FIG. 1 illustrates a case of a top emission type in which the pixel electrode 41 is formed of the reflective layer as an example. In the case of the top emission type, the flexible substrate 11 is disposed to face the bending adjusting member 50. On the contrary, in a case of a back emission type in which the common electrode 43 is formed of the reflective layer, and the pixel electrode 41 is formed of the semi-transmitting film or the transparent conductive layer, the thin film encapsulation layer 13 is disposed so as to face the bending adjusting member 50.

Although not illustrated in FIG. 1, a planarization film for suppressing reflection of external light and a touch screen panel for a touch input may be attached to an external side of a display surface of the display panel 10.

In the meantime, the display panel 10 may be formed of a liquid crystal display panel, in which liquid crystal is injected, between two flexible substrates. In this case, the pixel circuit, the pixel electrode, and a first alignment layer are positioned in an internal surface of any one flexible substrate, and the common electrode, the color filter, and a second alignment layer are positioned in an internal surface of the other flexible substrate.

Referring to FIGS. 1 and 2, the bending adjusting member 50 is basically formed in a rod shape, and is disposed in parallel to a long side or a short side of the display panel 10. A longitudinal direction (an x-axis direction of FIG. 1) of the bending adjusting member 50 corresponds to a direction in which the display panel 10 is bent. FIG. 1 illustrates a case in which the bending adjusting member 50 is disposed in parallel to the long side of the display panel 10 as an example.

The bending adjusting member 50 may be formed to have the same length as or a larger length than a length of the display panel 10. Further, a width of the bending adjusting member 50 may correspond to both cases where the width of the bending adjusting member 50 is equal to or smaller than or is larger than a width of the display panel 10. FIG. 1 illustrates a case where the length of the bending adjusting member 50 is larger than the length of the display panel 10, and the width of the bending adjusting member 50 is smaller than the width of the display panel 10 as an example.

The bending adjusting member 50 is formed in a concavely bent shape in a width direction (a y-axis direction of FIG. 1). That is, the bending adjusting member 50 forms a predetermined curvature in the width direction. The bending adjusting member 50 has predetermined elasticity in the width direction and the longitudinal direction, and may be formed of any one of metal and plastic.

The bending adjusting member 50 may be disposed so that a concavely bent surface faces the display panel 10, and an adhesive layer 60 (see FIG. 2) may be positioned on the concave surface of the bending adjusting member 50. The adhesive layer 60 may be formed of an adhesive material having a predetermined stretch ratio in the width direction and the longitudinal direction of the bending adjusting member 50.

Figure 4:
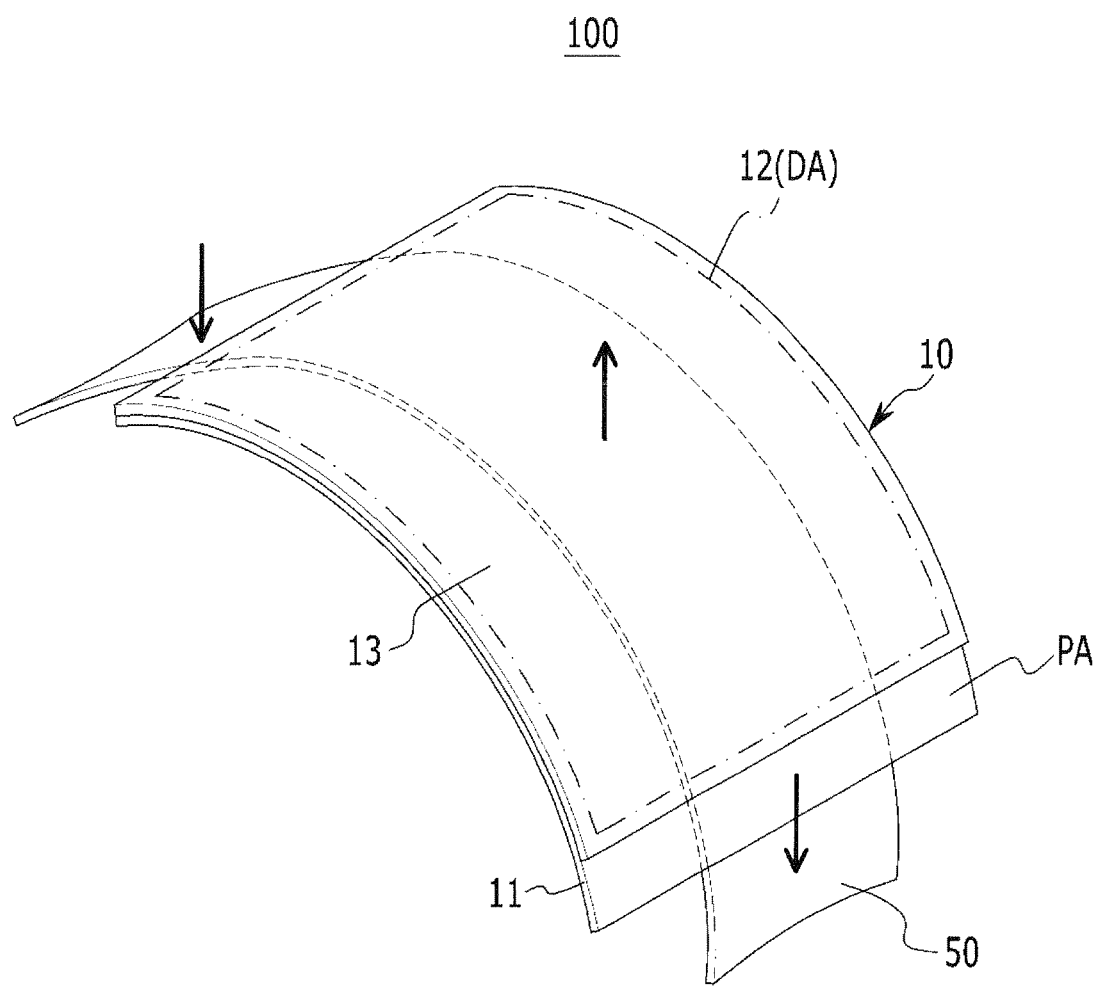
FIG. 4 is a perspective view illustrating a bending state of the display panel illustrated in FIG. 1.

FIG. 4 is a perspective view illustrating the bending state of the display panel illustrated in FIG. 1.

Referring to FIGS. 1 and 4, when external force is applied to the bending adjusting member 50 in the flat state, the bending adjusting member 50 is bent in the longitudinal direction to bend the display panel 10. Further, the bent bending adjusting member 50 is changed to the flat state again when external force in an opposite direction is applied, to return the display panel 10 to the plane state. In this case, the bending adjusting member 50 uniformly maintains the shape thereof in each of the flat state and the bending state, so that the shape of the display panel 10 may be uniformly maintained.

Particularly, when first external force (see an arrow of FIG. 4) is applied to both side ends of the bending adjusting member 50 in the same direction, the bending adjusting member 50 is deformed in a direction, in which the curvature is decreased, in the width direction and then is bent in the longitudinal direction when the external force is about to overcome elastic restoration force in the width direction. Further, the once bent bending adjusting member 50 maintains the shape thereof.

Further, when the bent bending adjusting member 50 receives external force (second external force) having the same size as and an opposite direction to that of previously applied external force (first external force), the bending adjusting member 50 returns to the initial flat state. That is, the bending adjusting member 50 is stretched in the longitudinal direction and simultaneously maintains an initial curvature state in the width direction. An operation of the bending adjusting member 50 has the same principle as that of a portable tapeline in which a measurement tape including drawn gradations is changed between two states of a straight line state and a winding (that is, bending) state in a roll shape.

The aforementioned bending adjusting member 50 may allow the display panel 10 to be bent in the longitudinal direction while confining deformation of the display panel 10 according to the width direction. That is, the bending adjusting member 50 serves to permit the display panel 10 to be bent in one direction parallel to the longitudinal direction of the bending adjusting member 50.

The deformation of the bending adjusting member 50 may be caused by force applied by a hand of a user. In this case, when the length of the bending adjusting member 50 is larger than the length of the display panel 10, the user may apply external force to the bending adjusting member 50 from the outside of the display panel 10 without touching the display panel 10, thereby preventing the display panel 10 from being damaged due to the external force.

As described above, the display device 100 of the first exemplary embodiment may easily change a state of the display panel 10 to any one of the plane state and the bending state by deforming the bending adjusting member 50 according to the direction and intensity of force applied to the bending adjusting member 50. Further, the display panel 10 may uniformly maintain the shape of thereof by the bending adjusting member 50 in each of the plane state and the bending state.

The display device 100 of the first exemplary embodiment may be applied to an electronic device, such as a mobile phone or an electronic watch. Further, the user may variously utilize an electronic device, such as using an electronic device in a flat state or wearing an electronic device on a wrist of the user by bending the electronic device.

Figure 5:
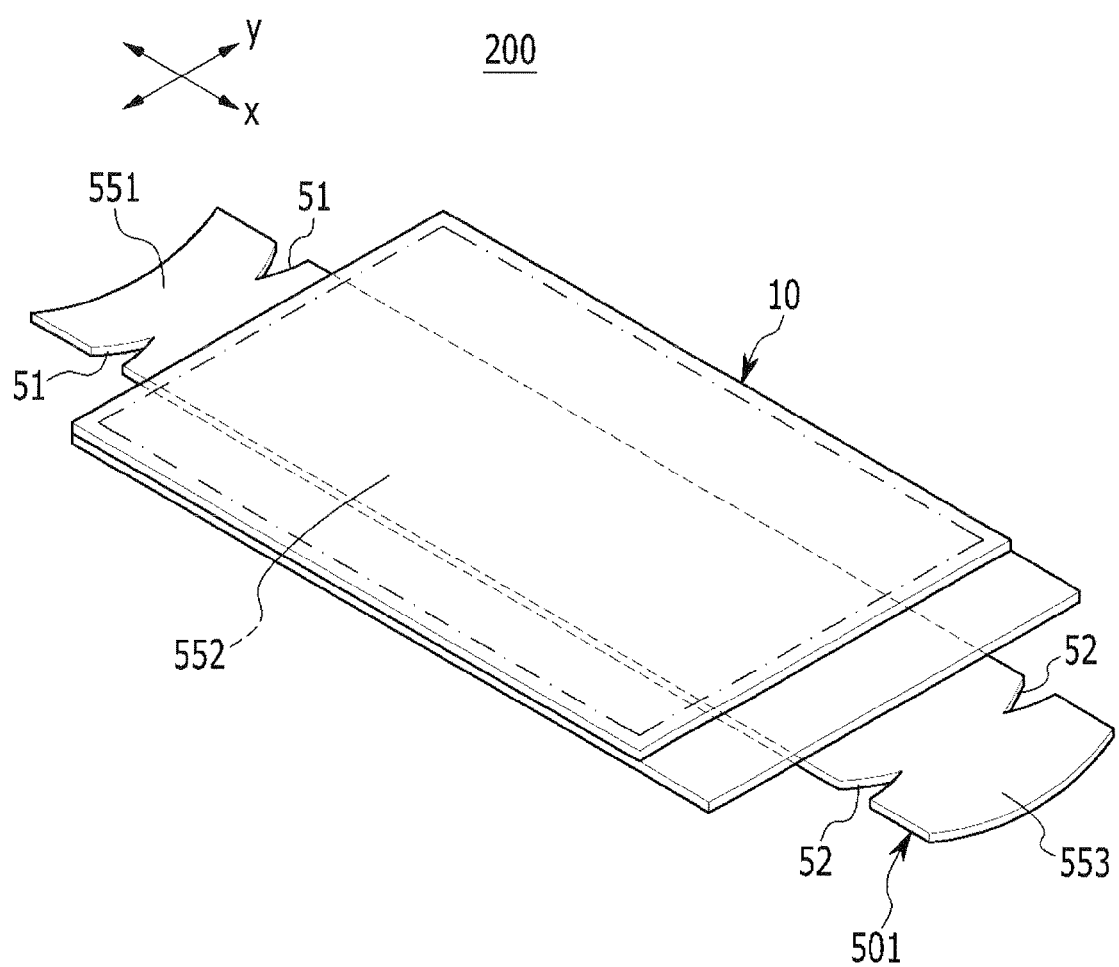
FIGS. 5 and 6 are perspective views of a display device according to a second exemplary embodiment.
Figure 6:
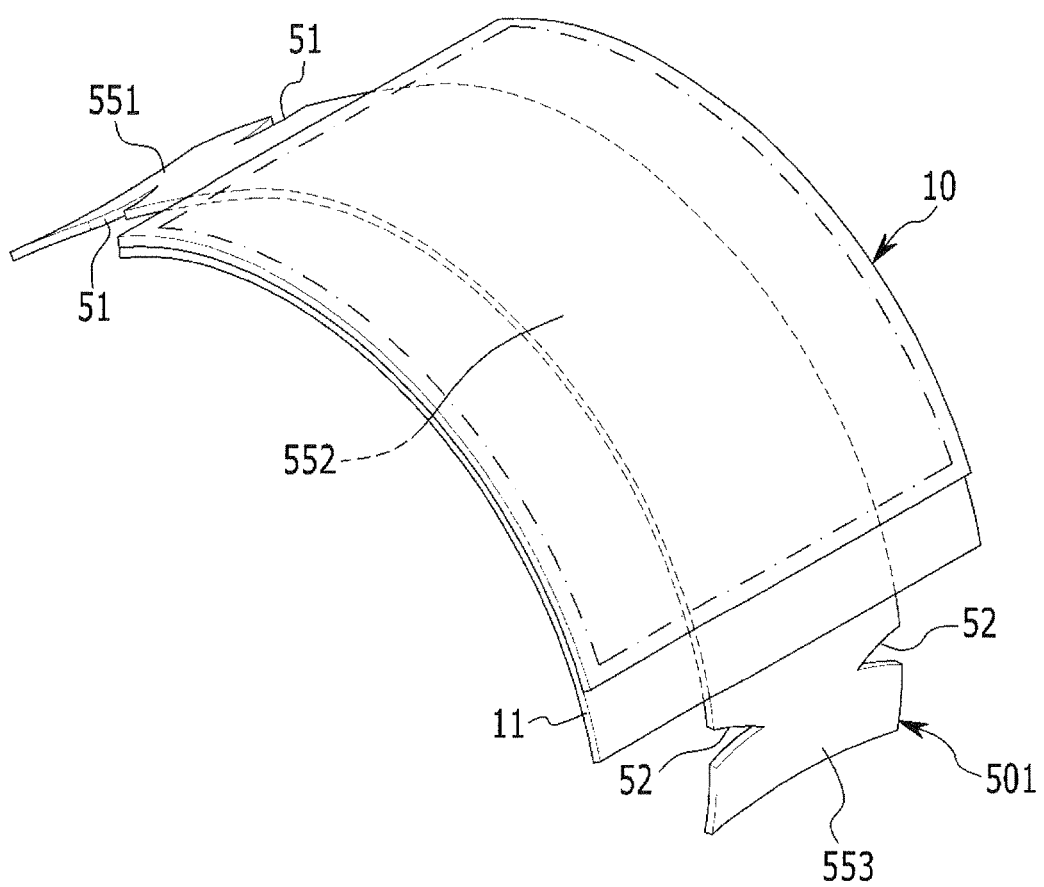

FIGS. 5 and 6 are perspective views of a display device according to a second exemplary embodiment.

Referring to FIGS. 5 and 6, a display device 200 of the second exemplary embodiment includes the same configurations as that of the first exemplary embodiment, except for two pairs of concave recesses (first concave recesses 51 and second concave recesses 52) provided at the bending adjusting member 501. The same reference numeral is used for the same member as that of the first exemplary embodiment.

The first concave recess 51 and the second concave recess 52 are formed in both side surfaces of the bending adjusting member 501 parallel to the longitudinal direction, and are spaced apart from an end portion of the bending adjusting member 501. The first concave recess 51 and the second concave recess 52 form a pair to face each other in a width direction. The length of the bending adjusting member 501 may be larger than the length of the display panel 10, and the first concave recess 51 and the second concave recess 52 are positioned outside the display panel 10.

A portion of the bending adjusting member 501 in which the first concave recesses 51 and the second concave recesses 52 are formed has a smaller width than another portion, so that the portion is easily bent even by small external force. Accordingly, the first concave recesses 51 and the second concave recesses 52 serve as bending points by which the bending adjusting member 501 is bent, and serve to decrease an intensity of external force necessary for deforming the bending adjusting member 501. FIG. 5 illustrates the triangular shaped concave recess, but the concave recess may be formed in various shapes, such as a semicircle shape.

The bending adjusting member 501 is divided into a plurality of bending areas by the first concave recesses 51 and the second concave recesses 52 in the longitudinal direction. That is, the bending adjusting member 501 is divided into a first bending area 551 positioned between one end portion of the bending adjusting member 501 and the first concave recess 51, a second bending area 552 positioned between the first concave recess 51 and the second concave recess 52, and a third bending area 553 positioned between the second concave recess 51 and an opposite-side end portion of the bending adjusting member 501.

The first to third bending areas 551, 552, and 553 are independently maintained in any one state between the flat state and the bending state. That is, each of the first to third bending areas 551, 552, and 553 may be independently maintained in any one state between the flat state and the bending state regardless of a shape of the adjacent bending region.

In the second exemplary embodiment, since the first concave recess 51 and the second concave recess 52 are positioned outside the display panel 10, the display panel 10 faces only the second bending area 552 and is bent at a single curvature according to a curvature of the second bending area 552 when the second bending area 552 is bent. FIG. 6 illustrates a case where the second bending area 552 is bent so that the display panel 10 is also bent together with the second bending area 552.

Figure 7:
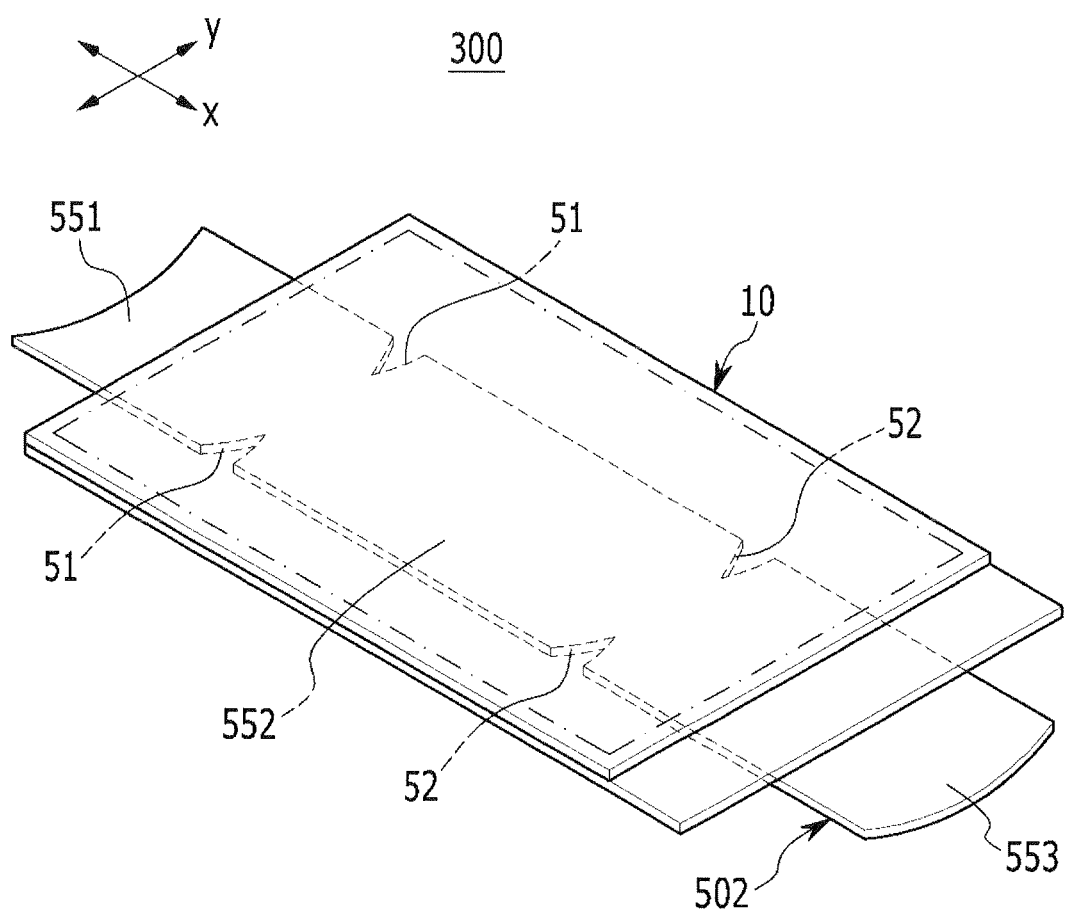
FIG. 7 is a perspective view of a display device according to a third exemplary embodiment.

FIG. 7 is a perspective view of a display device according to a third exemplary embodiment.

Referring to FIG. 7, a display device 300 of the third exemplary embodiment has the same configuration as that of the aforementioned second exemplary embodiment except for the first concave recesses 51 and the second concave recesses 52 of the bending adjusting member 502 formed at positions facing the display panel 10. The same reference numeral is used for the same member as that of the second exemplary embodiment.

The bending adjusting member 502 is divided into a first bending area 551, a second bending area 552, and a third bending area 553 in the longitudinal direction, and the display panel 10 faces all of the first to third bending areas 551, 552, and 553. The first to third bending areas 551, 552, and 553 are independently maintained in any one state between the flat state and the bending state. Accordingly, the display panel 10 may have different shapes in the three areas corresponding to the first to third bending areas 551, 552, and 553, respectively.

As each of the first to third bending areas 551, 552, and 553 has a larger length, each of the first to third bending areas 551, 552, and 553 is bent at a smaller curvature in the bending state. When the first to third bending areas 551, 552, and 553 have the same length, the first to third bending areas 551, 552, and 553 are bent at the same curvature in the bending state. When the second bending area 552 has a larger length than the first and third bending areas 551 and 553, the second bending area 552 is bent at a smaller curvature than the first and third bending areas 551 and 553 in the bending state.

As described above, the curvature for each area of the display panel 10 may be variously set according to the length of the first to third bending areas 551, 552, and 553. FIG. 7 illustrates a case where the length of the second bending area 552 is larger than the lengths of the first and third bending areas 551 and 553 as an example.

FIGS. 8A to 8D are front views of the display device illustrated in FIG. 7.

Figure 8A:
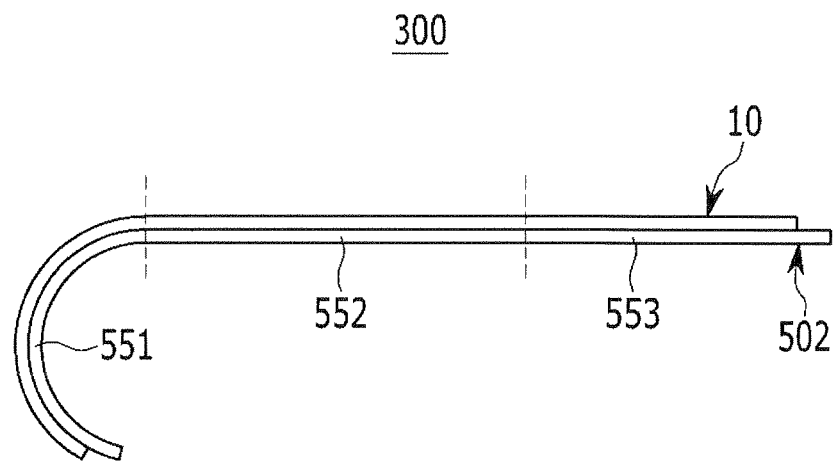
FIGS. 8A to 8D are front views of the display device illustrated in FIG. 7.

Referring to FIG. 8A, only the first bending area 551 in the bending adjusting member 502 may be bent. In this case, in the display panel 10, only an area corresponding to the first bending area 551 is maintained in the bending state, and the remaining areas are maintained in the plane state.

Figure 8B:
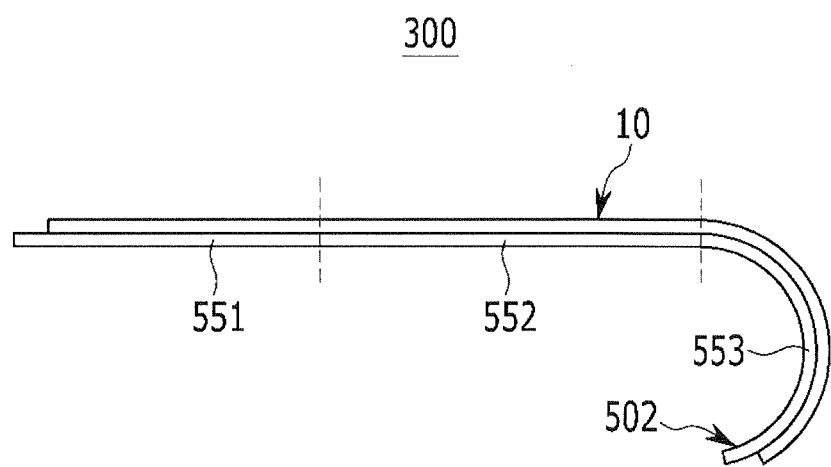

Referring to FIG. 8B, only the third bending area 553 in the bending adjusting member 502 may be bent. In this case, in the display panel 10, only an area corresponding to the third bending area 553 is maintained in the bending state, and the remaining areas are maintained in the plane state.

Figure 8C:
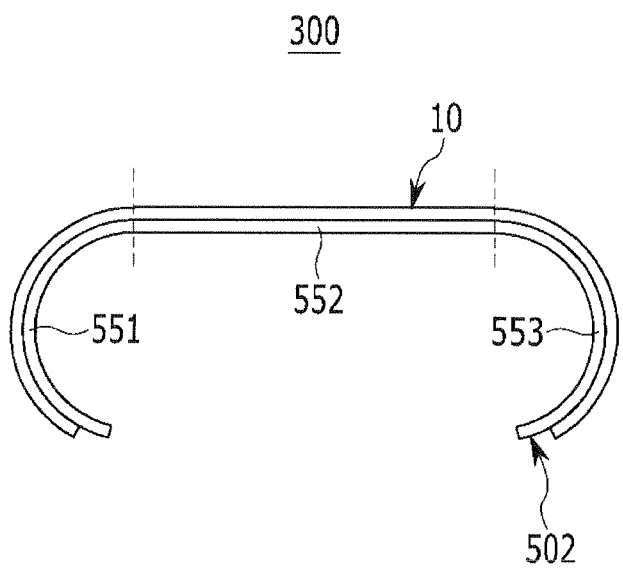

Referring to FIG. 8C, the first bending area 551 and the third bending area 553 in the bending adjusting member 502 may be bent. In this case, in the display panel 10, areas corresponding to the first and third bending area 551 and 553 are maintained in the bending state, and the area corresponding to the second bending area 552 is maintained in the plane state.

Figure 8D:
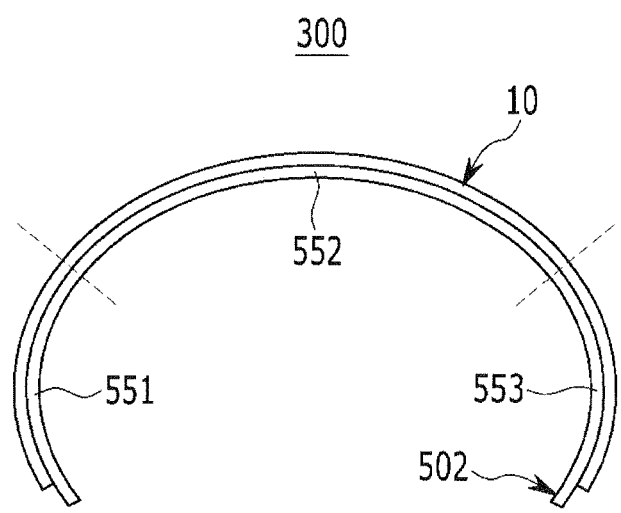

Referring to FIG. 8D, all of the first to third bending areas 551, 552, and 553 of the bending adjusting member 502 may be bent. In this case, the entire display panel 10 may be maintained in the bending state.

Figure 9:
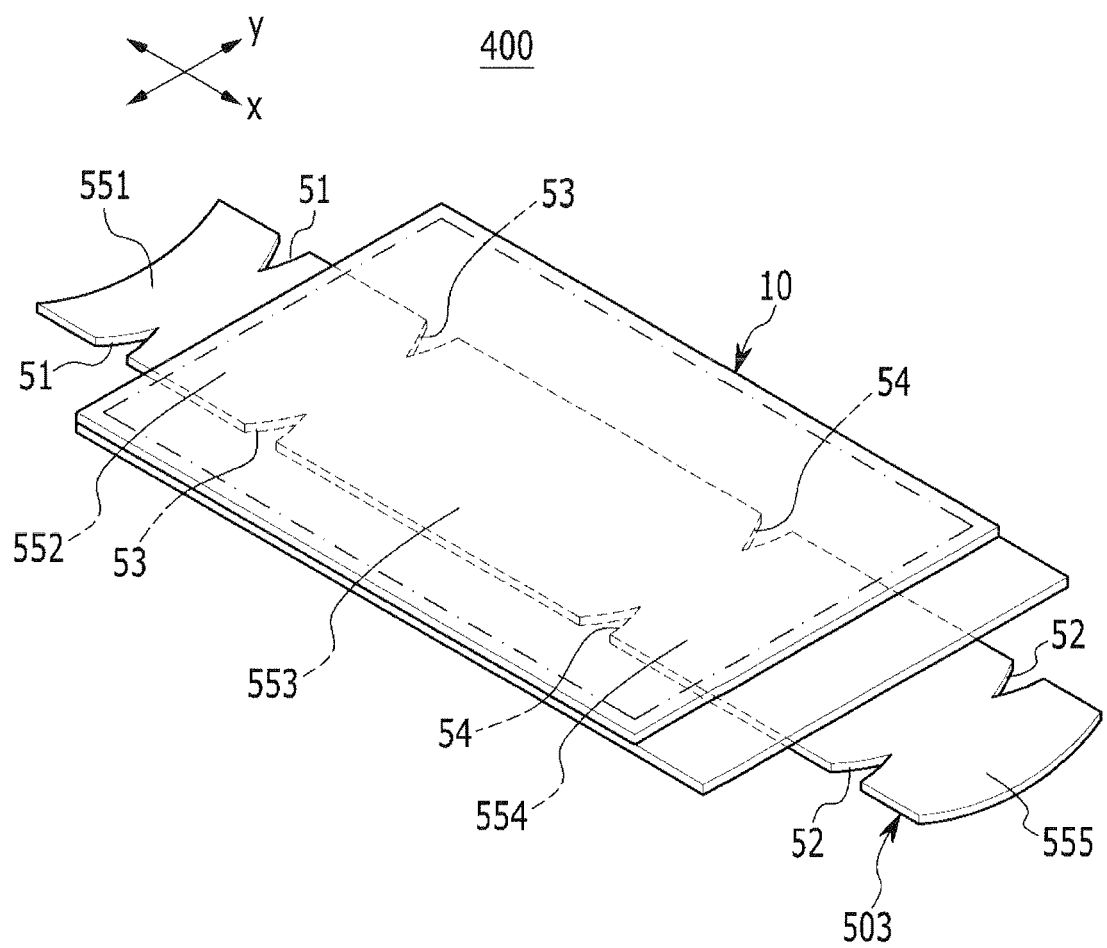
FIG. 9 is a perspective view of a display device according to a fourth exemplary embodiment.

FIG. 9 is a perspective view of a display device according to a fourth exemplary embodiment.

Referring to FIG. 9, a display device 400 of the fourth exemplary embodiment includes the same configuration as that of the aforementioned second exemplary embodiment, except for two pairs of concave recesses (third concave recesses 53 and fourth concave recesses 54) further provided at the bending adjusting member 503. The same reference numeral is used for the same member as that of the second exemplary embodiment.

The first concave recesses 51 and the second concave recesses 52 are positioned at an external side of the display panel 10, and the third concave recesses 53 and the fourth concave recesses 54 are positioned at positions facing the display panel 10. The bending adjusting member 503 is divided into a first bending area 551, a second bending area 552, a third bending area 553, a fourth bending area 554, and a fifth bending area 555 in the longitudinal direction, and the display panel 10 faces the second to fourth bending areas 552, 553, and 554.

The first concave recesses 51 and the second concave recesses 52 serve as bending points by which the bending adjusting member 503 is easily bent. The second to fourth bending areas 552, 553, and 554 are independently maintained in any one state between the flat state and the bending state. Accordingly, the display panel 10 may have different shapes in the three areas corresponding to the second to fourth bending areas 552, 553, and 554, respectively.

FIG. 9 illustrates a case where the two pairs of concave recesses (the third concave recesses 53 and the fourth concave recesses 54) are formed in the area of the bending adjusting member 503 facing the display panel 10, but one pair of concave recesses or three or more pairs of concave recesses may be formed in the area facing the display panel 10. The bending state of the display panel 10 may be variously controlled according to the number and the lengths of the bending areas facing the display panel 10.

It is possible to easily change a state of the display panel to any one between the plane state and the bending state by changing the bending adjusting member according to a direction and an intensity of power applied to the bending adjusting member. Further, it is possible to uniformly maintain a shape of the display panel through the bending adjusting member in each of the plane state and the bending state. Further, it is possible to variously adjust a bending shape of the display panel according to the number and the lengths of the bending areas facing the display panel.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a display panel including a flexible substrate and a display unit; and
a bending adjusting member fixed to a rear surface of the display panel, and changeable between a flat state and a bending state by external force,
wherein the bending adjusting member is bent in a width direction to form a curvature, has elasticity in the width direction and a longitudinal direction, and is maintained in any one state between the flat state and the bending state under a condition of non-application of external force,
wherein the bending adjusting member is provided with at least two pairs of concave recesses in both side surfaces parallel in the longitudinal direction, and is divided into at least three bending areas in the longitudinal direction by at least two pairs of concave recesses, and
wherein each of at least three bending areas is independently changeable between the flat state and the bending state.

2. The display device of claim 1, wherein:
the bending adjusting member is bent in the longitudinal direction by first external force to be switched to the bending state, and returns to the flat state by second external force, and
the first external force and the second external force have the same intensity and opposite directions.

3. The display device of claim 2, wherein:
the bending adjusting member is disposed so that a concave surface faces the display panel, and
an adhesive layer is positioned between the display panel and the bending adjusting member.

4. The display device of claim 3, wherein:
the adhesive layer has a stretch ratio in the width direction and the longitudinal direction of the bending adjusting member.

5. The display device of claim 1, wherein:
a length of the bending adjusting member is larger than a length of the display panel, and
the bending adjusting member is provided with a pair of first concave recesses and a pair of second concave recesses at an external side of the display panel.

6. The display device of claim 5, wherein:
the display panel faces one bending area positioned between the pair of first concave recesses and the pair of second concave recesses.

7. The display device of claim 1, wherein:
the bending adjusting member is provided with one pair of third concave recesses and one pair of fourth concave recesses at positions facing the display panel, and
the display panel faces three bending areas divided by the one of the pairs of first to fourth concave recesses.

8. The display device of claim 1, wherein:
the bending adjusting member is provided with one pair of first concave recesses and one pair of second concave recesses at positions facing the display panel, and
the display panel faces three bending areas divided by the one pair of first and second concave recesses.

9. The display device of claim 1, wherein:
the display panel is an organic light emitting display panel.

10. A display device, comprising:
a display panel including a flexible substrate and a display unit; and
a bending adjusting member fixed to a rear surface of the display panel, and changeable between a flat state and a bent state; said bending adjusting member comprising;
at least two pairs of concave recesses in both side surfaces parallel in the longitudinal direction; and
a bending area between each pair of concave recesses and on opposite ends of the bending adjusting member in the longitudinal direction,
wherein the switching between the flat and bent state occurs individually at each of the bending areas.

11. The display device of claim 10, wherein a length of the bending adjusting member is larger than a length of the display panel.

12. The display device of claim 10, wherein the bending adjusting member is disposed so that a concave surface faces the display panel; and
an adhesive layer is positioned between the display panel and the bending adjusting member.

13. The display device of claim 12, wherein the adhesive layer has a stretch ratio in the width direction and the longitudinal direction of the bending adjusting member.

14. The display device of claim 13, wherein the bending adjusting member is bent in a width direction to form a curvature, has elasticity in the width direction and a longitudinal direction, and is maintained in any one state between the flat state and the bent state under a condition of non-application of external force.

* * * * *